(12) United States Patent
Albrecht et al.

(10) Patent No.: US 12,500,126 B2
(45) Date of Patent: Dec. 16, 2025

(54) METHODS FOR IMPLANTING SEMICONDUCTOR STRUCTURES WITH IONS

(71) Applicant: GlobalWafers Co., Ltd, Hsinchu (TW)

(72) Inventors: Peter Daniel Albrecht, O'Fallon, MO (US); Junnan Wu, Ipswich, MA (US)

(73) Assignee: GlobalWafers Co., Ltd., Hsinchu (TW)

( * ) Notice: Subject to any disclaimer, the term of this patent is extended or adjusted under 35 U.S.C. 154(b) by 889 days.

(21) Appl. No.: 17/520,280

(22) Filed: Nov. 5, 2021

(65) Prior Publication Data

US 2022/0208619 A1 Jun. 30, 2022

Related U.S. Application Data

(60) Provisional application No. 63/132,156, filed on Dec. 30, 2020.

(51) Int. Cl.
| | |
|---|---|
| *H01L 21/66* | (2006.01) |
| *C23C 14/48* | (2006.01) |
| *C23C 14/50* | (2006.01) |
| *C23C 14/54* | (2006.01) |
| *G01N 19/02* | (2006.01) |
| *H01J 37/20* | (2006.01) |
| *H01J 37/317* | (2006.01) |

(Continued)

(52) U.S. Cl.
CPC ............. *H01L 22/20* (2013.01); *C23C 14/48* (2013.01); *C23C 14/505* (2013.01); *C23C 14/541* (2013.01); *G01N 19/02* (2013.01); *H01J 37/20* (2013.01); *H01J 37/3171* (2013.01); *H01L 21/265* (2013.01); *H01L 21/67213* (2013.01); *H01L 21/68757* (2013.01); *H01L 21/68764* (2013.01); *H01L 21/68771* (2013.01)

(58) Field of Classification Search
CPC . H01L 22/20; H01L 21/265; H01L 21/68757; H01L 21/67213; H01L 21/68764; H01L 21/68771; H01J 37/3171; H01J 37/20; C23C 14/48; C23C 14/505; C23C 14/541; G01N 19/02

See application file for complete search history.

(56) References Cited

U.S. PATENT DOCUMENTS

| | | | | |
|---|---|---|---|---|
| 3,360,977 A | * | 1/1968 | Herman | G01N 19/02 73/9 |
| 5,389,793 A | * | 2/1995 | Aitken | H01J 49/30 250/442.11 |

(Continued)

FOREIGN PATENT DOCUMENTS

| | | |
|---|---|---|
| JP | H11162392 A | 6/1999 |
| JP | 2013016745 A | 1/2013 |

OTHER PUBLICATIONS

Translation of JP2013-016745.*

(Continued)

*Primary Examiner* — Helen C Kwok
(74) *Attorney, Agent, or Firm* — Armstrong Teasdale LLP

(57) ABSTRACT

Systems for implanting semiconductor structures with ions are disclosed. The semiconductor structure is positioned on a heatsink and ions are implanted through a front surface of the semiconductor structure to form a damage region in the semiconductor structure. A parameter related to the coefficient of friction of the heatsink is measured. The parameter is compared to a baseline range.

16 Claims, 12 Drawing Sheets

(51) Int. Cl.
*H01L 21/265* (2006.01)
*H01L 21/67* (2006.01)
*H01L 21/687* (2006.01)

(56) References Cited

U.S. PATENT DOCUMENTS

| | | | |
|---|---|---|---|
| 5,736,630 A | 4/1998 | Welner | |
| 6,330,820 B1* | 12/2001 | Cotterill | G01N 19/02 |
| | | | 73/9 |
| 6,458,723 B1 | 10/2002 | Henley et al. | |
| 6,545,267 B1 | 4/2003 | Miura et al. | |
| 6,677,594 B1* | 1/2004 | Young | H01L 21/67109 |
| | | | 414/217 |
| 2007/0199656 A1* | 8/2007 | Leavitt | H01L 21/68757 |
| | | | 156/345.11 |
| 2008/0044257 A1 | 2/2008 | England et al. | |
| 2009/0081424 A1* | 3/2009 | Gomi | H03H 3/02 |
| | | | 156/60 |
| 2010/0255198 A1* | 10/2010 | Cleary | C23C 16/4402 |
| | | | 427/255.39 |
| 2014/0367691 A1* | 12/2014 | Mitani | H01L 27/1259 |
| | | | 438/151 |
| 2020/0255940 A1* | 8/2020 | Kwon | H01J 37/32862 |
| 2020/0335386 A1* | 10/2020 | Hung | H01L 21/6719 |
| 2020/0370161 A1* | 11/2020 | Lefevre | H01J 37/34 |

OTHER PUBLICATIONS

J. Springer et al., "Elastomers for control of wafer temperature in the ≈50° C. range during high dose ion implantation," 2014 20th International Conference on Ion Implantation Technology (IIT), 2014, pp. 1-4.

International Search Report and Written Opinion for International Patent Application No. PCT/US2021/063866, 16 pages, Apr. 25, 2022.

\* cited by examiner

METHODS FOR IMPLANTING SEMICONDUCTOR STRUCTURES WITH IONS

CROSS-REFERENCE TO RELATED APPLICATION

This application claims the benefit of U.S. Provisional Patent Application No. 63/132,156, filed Dec. 30, 2020, which is incorporated herein by reference in its entirety.

FIELD OF THE DISCLOSURE

The field of the disclosure relates to methods for implanting semiconductor structures with ions, and more specifically, methods in which a parameter related to the coefficient of friction of a heatsink on which the semiconductor structure is positioned is measured.

BACKGROUND

Semiconductor structures may be implanted with ions in order to achieve desirable physical, chemical, and electrical properties. For example, to form a silicon-on-insulator structure, a donor structure may be implanted with ions to form a damage region in the structure at which the structure is subsequently cleaved.

During ion implantation, a beam of ions (e.g., hydrogen atoms, helium atoms or a combination of hydrogen and helium atoms) are directed at the semiconductor structure. A scanning wheel may be used to support a batch of semiconductor structures during ion implantation. The semiconductor structures are arranged circumferentially about a central axis about which the scanning wheel rotates. The scanning wheel rotates to repeatedly pass the semiconductor structures through a stationary ion beam to distribute ions over the surfaces of the semiconductor structures. The temperature of semiconductor structures during ion implantation is controlled to maintain consistent implantation.

During ion implantation, heat is generated in the semiconductor structure. Conventional methods for controlling the temperature of semiconductor structures involve dissipating heat to a heatsink which is in contact with the semiconductor structure during ion implantation. Heatsinks may be coated with a polymer coating, such as an elastomeric coating, to improve heat transfer between the semiconductor structure and the heatsink. Semiconductor structures may be attached and detached from a heatsink such that the heatsink may be reused for multiple ion implantation processes. Over the lifespan of the heatsink, mechanical wear and degassing under the high vacuum environment of the ion processing system causes degradation and wear of the elastomeric coating. The degradation of the coating diminishes the ability to effectively transfer heat to the heatsink, causing inconsistencies in the temperature of the semiconductor structures, leading to production variations and yields production losses.

A need exists for methods that evaluate the quality of a heatsink (e.g., heatsink coating) to determine if the heatsink is suitable for use during ion implantation or if the heatsink should be reconditioned prior to an ion implantation process.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for implanting semiconductor structures with ions. The semiconductor structure has a front surface and rear surface opposite the front surface. A semiconductor structure is positioned on a heatsink with the rear surface of the semiconductor structure contacting the heatsink. Ions are implanted through the front surface of the semiconductor structure while the semiconductor structure is positioned on the heatsink to form a damage region in the semiconductor structure. A parameter related to the coefficient of friction of the heatsink is measured. The parameter is compared to a baseline range. If the parameter falls outside of the baseline range, the heatsink is reconditioned. If the parameter falls within the baseline range, the heatsink is used during ion implantation of additional semiconductor structures.

Another aspect of the present disclosure is directed to a method for evaluating suitability of a heatsink for ion implantation of a semiconductor structure. The heatsink includes a substrate and an elastomeric coating disposed on at least one surface of the substrate. A parameter related to the coefficient of friction of the elastomeric coating is measured. The parameter is compared to a baseline range. If the parameter falls outside of the baseline range, the heatsink is reconditioned. If the parameter falls within the baseline range, the heatsink is used during ion implantation of the semiconductor structure.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
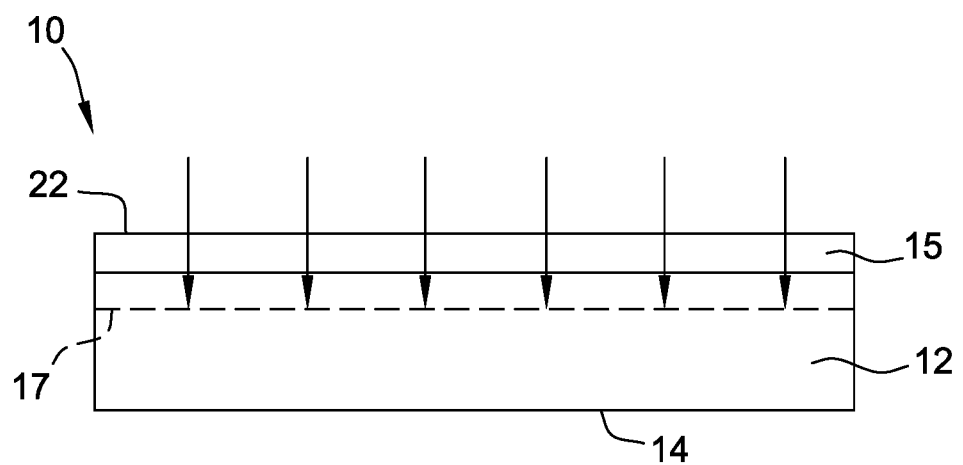
FIG. 1 is a schematic side view of a semiconductor structure.

Provisions of the present disclosure relate to methods for evaluating the quality of heatsinks used during ion implantation of a semiconductor structure. Generally, the semiconductor structure may be any structure in which it is desired to implant ions. In some embodiments, the semiconductor structure is a layered structure such as a donor structure used to produce a silicon-on-insulator structure. Referring to FIG. 1, an example structure 10 is a layered structure comprising a donor wafer 12 and a dielectric layer 15 (e.g., silica) such as the structure disclosed in U.S. Pat. No. 10,679,908, which is incorporated herein by reference for all relevant and consistent purpose. Ions (indicated by arrows) are implanted into the structure 10 through the surface 22 to form a cleave plane 17. The ion-implanted structure 10 may be bonded to a handle structure and cleaved to form a silicon-on-insulator structure. Suitable structures that may be ion implanted may be composed of silicon, germanium, silicon germanium, gallium nitride, aluminum nitride, gallium arsenide, indium gallium arsenide and any combination thereof.

Figure 5:
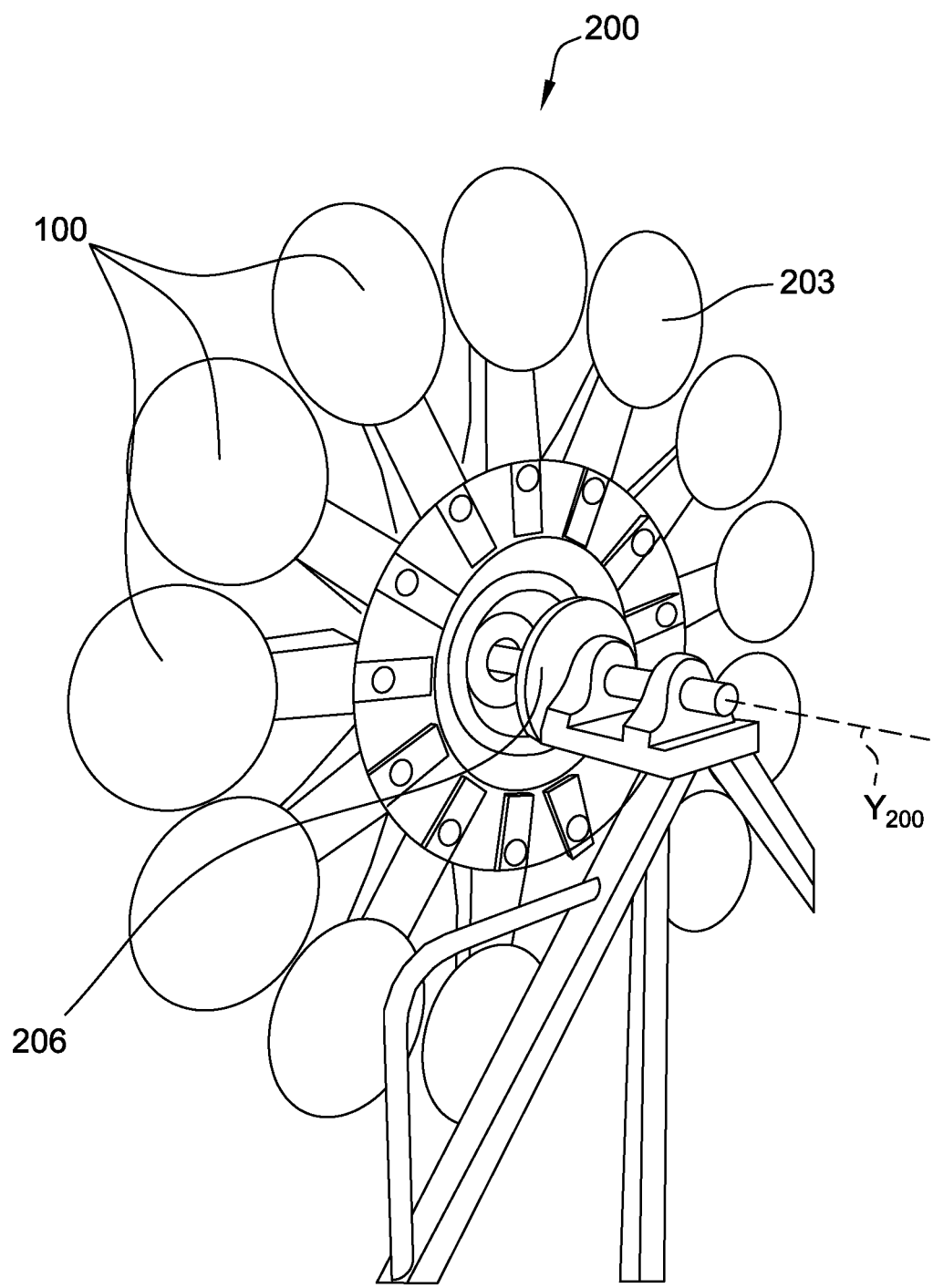
FIG. 5 is a perspective front view of an implanter apparatus.

With reference to FIG. 5, to implant ions into the semiconductor structure 10, the structure 10 is positioned on a heatsink 100 of an ion implanter apparatus 200. The structure 10 is positioned with the rear surface 14 of the semiconductor structure 10 contacting the heatsink 100. The semiconductor structures 10 and heatsinks 100 are rotated while a beam of ions are directed at the structure 10 to form the cleave plane 17 in the semiconductor structure 10.

During ion implantation, heat is generated in the semiconductor structure 10. The heatsink 100 regulates the temperature of the semiconductor structure 10 during ion implantation by dissipating heat from the semiconductor structure 10 to the heatsink 100.

Figure 2:
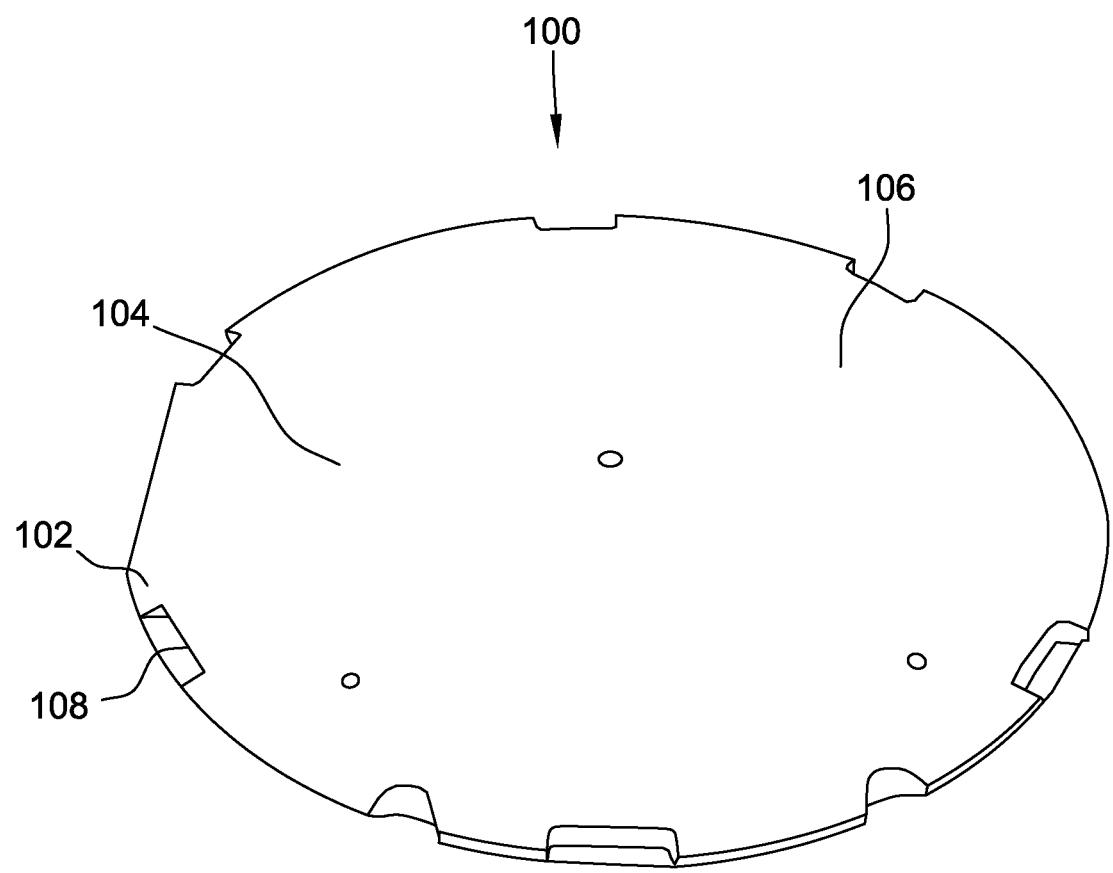
FIG. 2 is a top perspective view of a heatsink.
Figure 3:
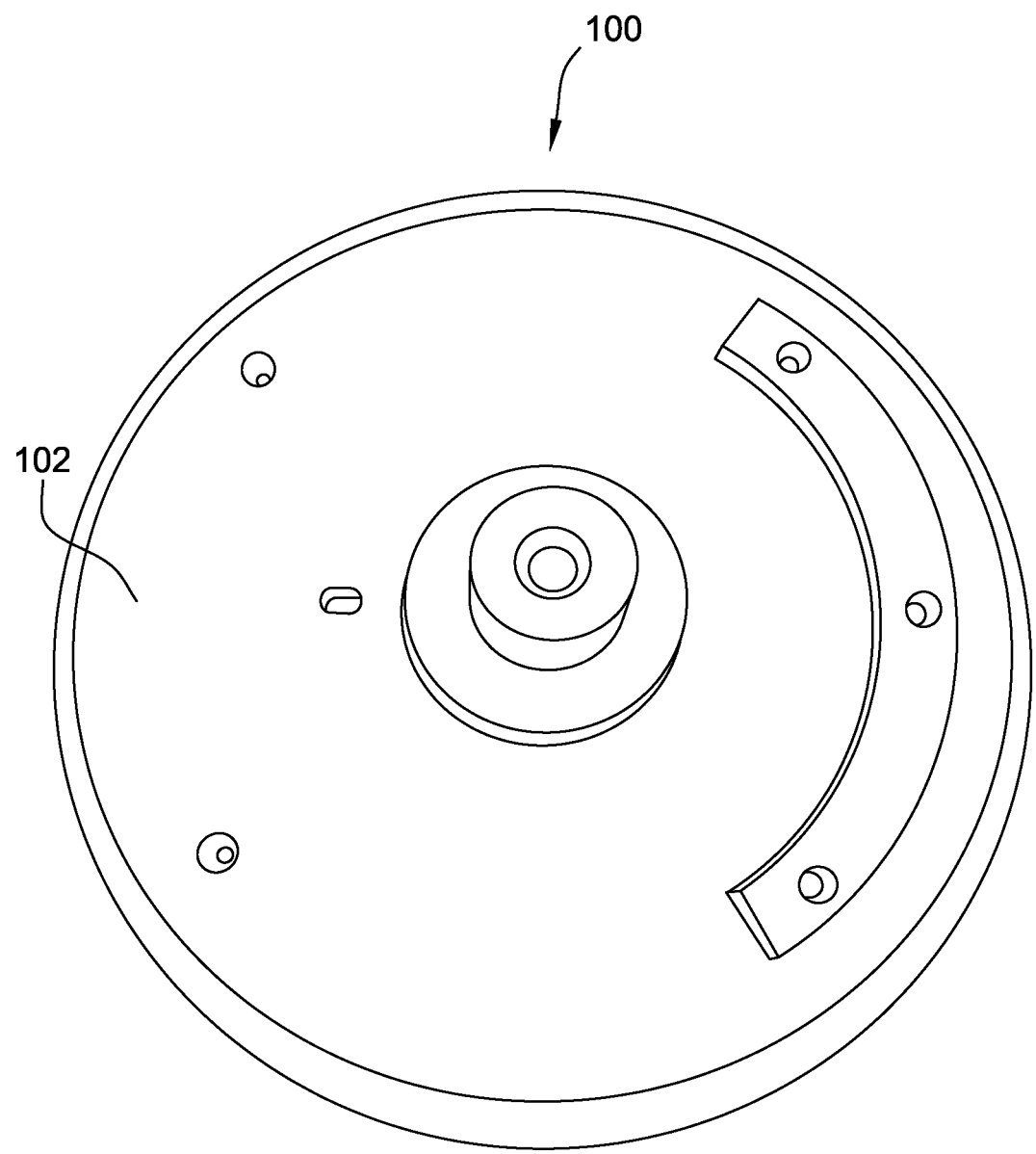
FIG. 3 is a bottom view of the heatsink.
Figure 4:
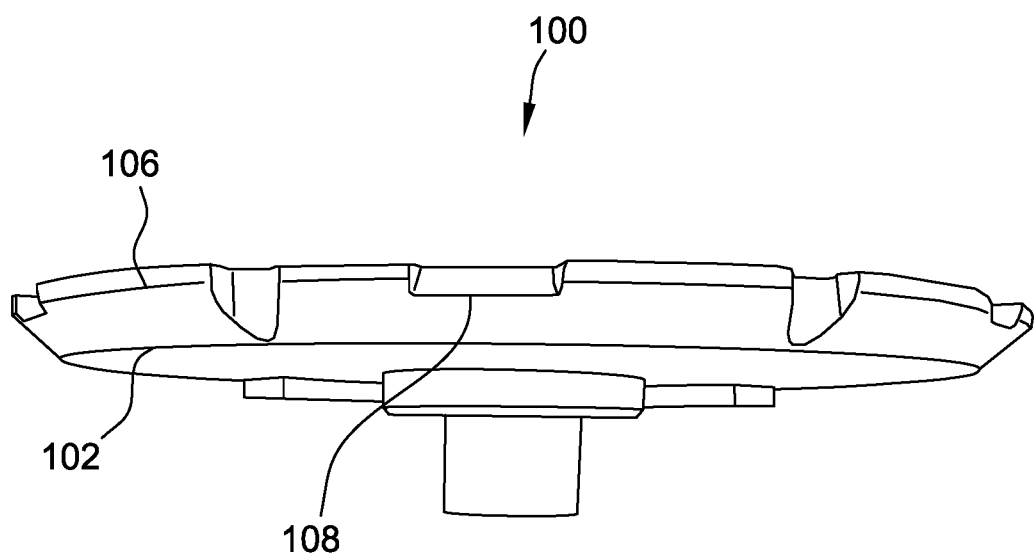
FIG. 4 is a side view of the heatsink.

Referring now to FIG. 2, the heatsink 100 includes a substrate 102 and an elastomeric coating 104 at least partially disposed on the top surface 106 of the substrate 102. The surface 106 is sized and shaped to support the rear surface 14 of the semiconductor structure 10. The elastomeric coating 104 contacts the semiconductor structure 10 during ion implantation. The substrate 102 may be made of aluminum and/or stainless steel. The elastomeric coating 104 may be made of any suitable elastomer known to those of skill in the art. Example elastomers include silicone elastomers such as silicone elastomers composed of polydimethyl siloxane (PDMS). The elastomeric coating 104 is used on the surface 106 of the heatsink 100 to increase thermal contact between the heatsink 100 and the semiconductor structure 10. The elastomeric coating 104 is thermally conductive and facilitates heat transfer from the semiconductor structure 10 to the heatsink 100. Specifically, the elastomeric coating 104 improves heat conduction from the semiconductor structure 10 to the heatsink 100 during ion implantation to dissipate heat and control the temperature of the semiconductor structure 10.

To load semiconductor structure 10 into the implanter 200, the semiconductor structure 10 is loaded onto the heatsink 100 and the rear surface 14 is pressed against the elastomeric coating 104 using spring loaded clips (not shown) that retain the semiconductor structure 10 onto the heatsink 100. The heatsink 100 may include one or more grooves 108 at the circumferential edge of the heatsink. The grooves 108 are used for alignment and attaching the spring loaded clips onto the heatsink 100. Other mechanisms or features may be used to initially retain the position of the semiconductor structure 10 onto the heatsink 100.

Figure 6:
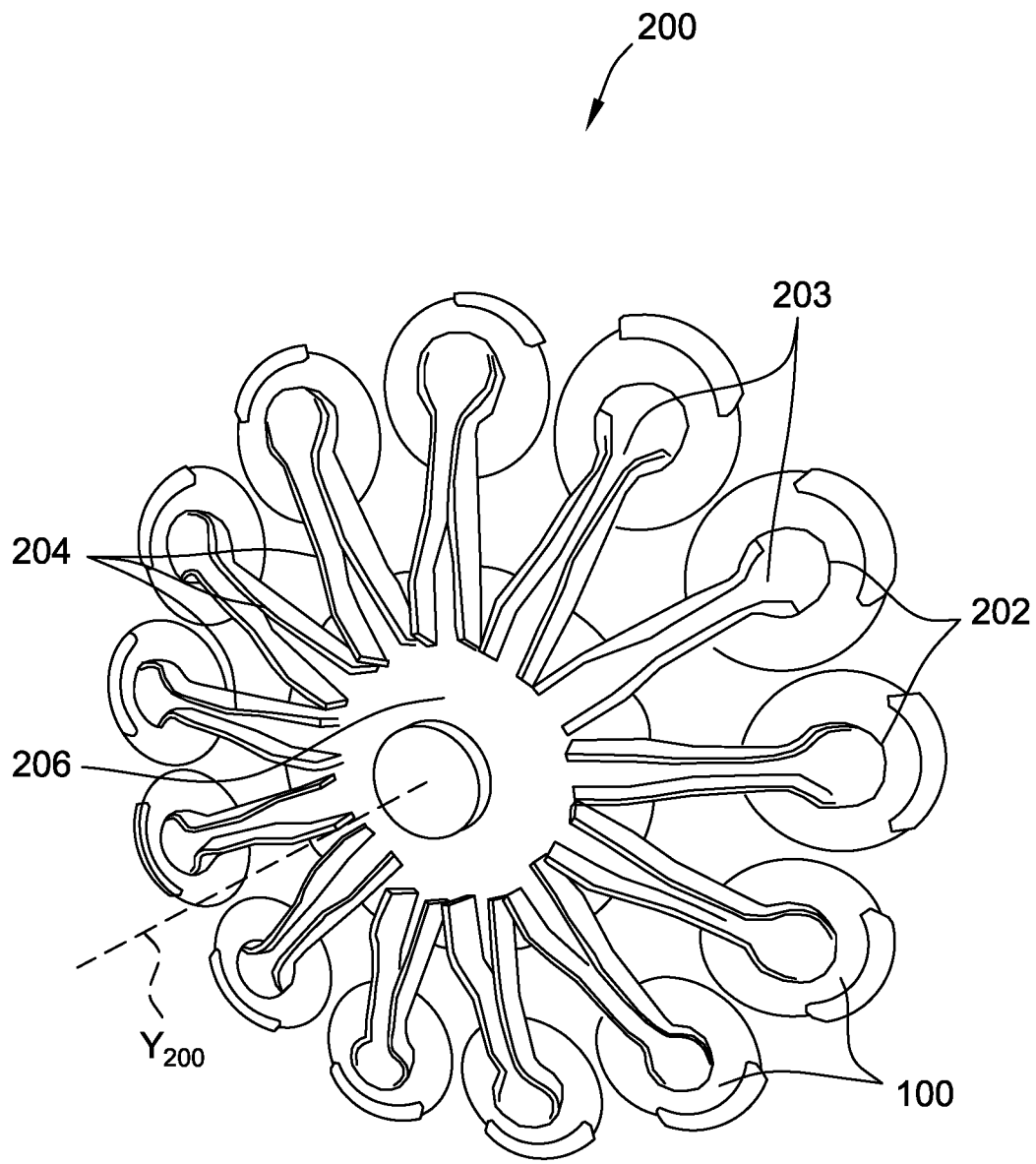
FIG. 6 is a perspective rear view of the implanter apparatus.

Referring now to FIG. 5, the ion implanter apparatus 200 (also referred to as a scanning wheel) carries a plurality of semiconductor structures 10 during ion implantation with a structure 10 being disposed on each heatsink 100. The ion implanter apparatus 200 includes supports 202 (FIG. 6) with a support 202 being removably connected to each heatsink 100. Each support 202 is disposed on a distal end 203 of an arm 204 which extends from a central hub 206. The supports 202 are arranged such that the semiconductor structures 10 and the heatsinks 100 are circumferentially disposed about a central axis $Y_{200}$, extending through the central hub 206, about which the heatsinks 100 rotate.

The ion implanter apparatus 200 rotates about the central axis $Y_{200}$ to pass the semiconductor structures 10 repeatedly through a stationary ion beam (not shown) to implant ions into each semiconductor structure 10. The ion implanter apparatus 200 may be disposed in a chamber (e.g., vacuum chamber) during ion implantation.

The ion implanter apparatus 200 rotates about the central axis $Y_{200}$ at relatively high rotational high speeds such as 500 rpm or more, 750 rpm or more, or 1000 rpm or more (e.g., 500 rpm to 2000 rpm). Initially, the heatsink may be held in place by clips. The clips open when a threshold centrifugal force is reached during ramp-up of the implanter apparatus (e.g., upon reaching a threshold rpm). Once the clips open, the semiconductor structures are retained by centrifugal force against retention structures without additional fasteners being used to retain the semiconductor structure against the heatsink 100. In some embodiments, the heatsink is fluid cooled having channels formed therein through which fluid is circulated.

The heatsink 100 may be used in multiple cycles of ion implantation. For example, the heatsink 100 may be reused for greater than 10,000 cycles of implantation. The ion implantation environment degrades the elastomeric coating 104 of the heatsink 100 (e.g., causing it to harden and/or shrink).

In accordance with embodiments of the present disclosure, a parameter related to the coefficient of friction of the elastomeric coating 104 may be used to evaluate the wear of the elastomeric coating 104. The parameter related to the coefficient of friction may be used to evaluate the heat transfer capacity of the heatsink 100. Alternatively or additionally, the parameter related to the coefficient of friction may be used to evaluate the peak temperature of the semiconductor structure 100 during ion implantation. The parameter related to the coefficient of friction may be used to determine if the heatsink 100 may be used for further ion implantation or if the heatsink 100 should not be used for a subsequent ion implantation (e.g., should be reconditioned instead). In some embodiments, the parameter related to the coefficient of friction may be used to determine whether the temperature of the semiconductor structure held by the heatsink 100 during ion implantation has shifted and downstream process parameters should be adjusted to compensate for the temperature difference.

Figure 7:
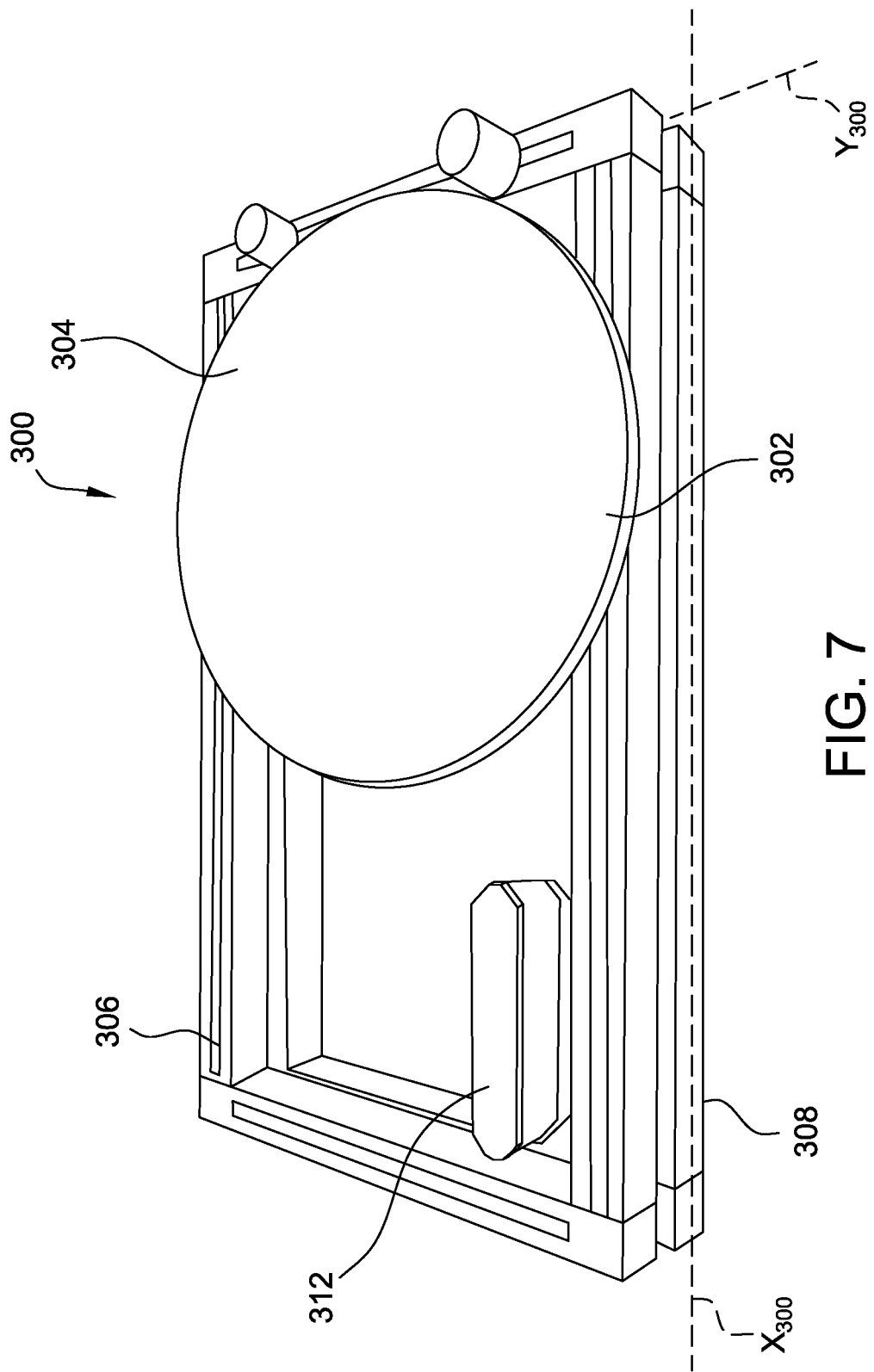
FIG. 7 is a perspective view of a testing apparatus.
Figure 8:
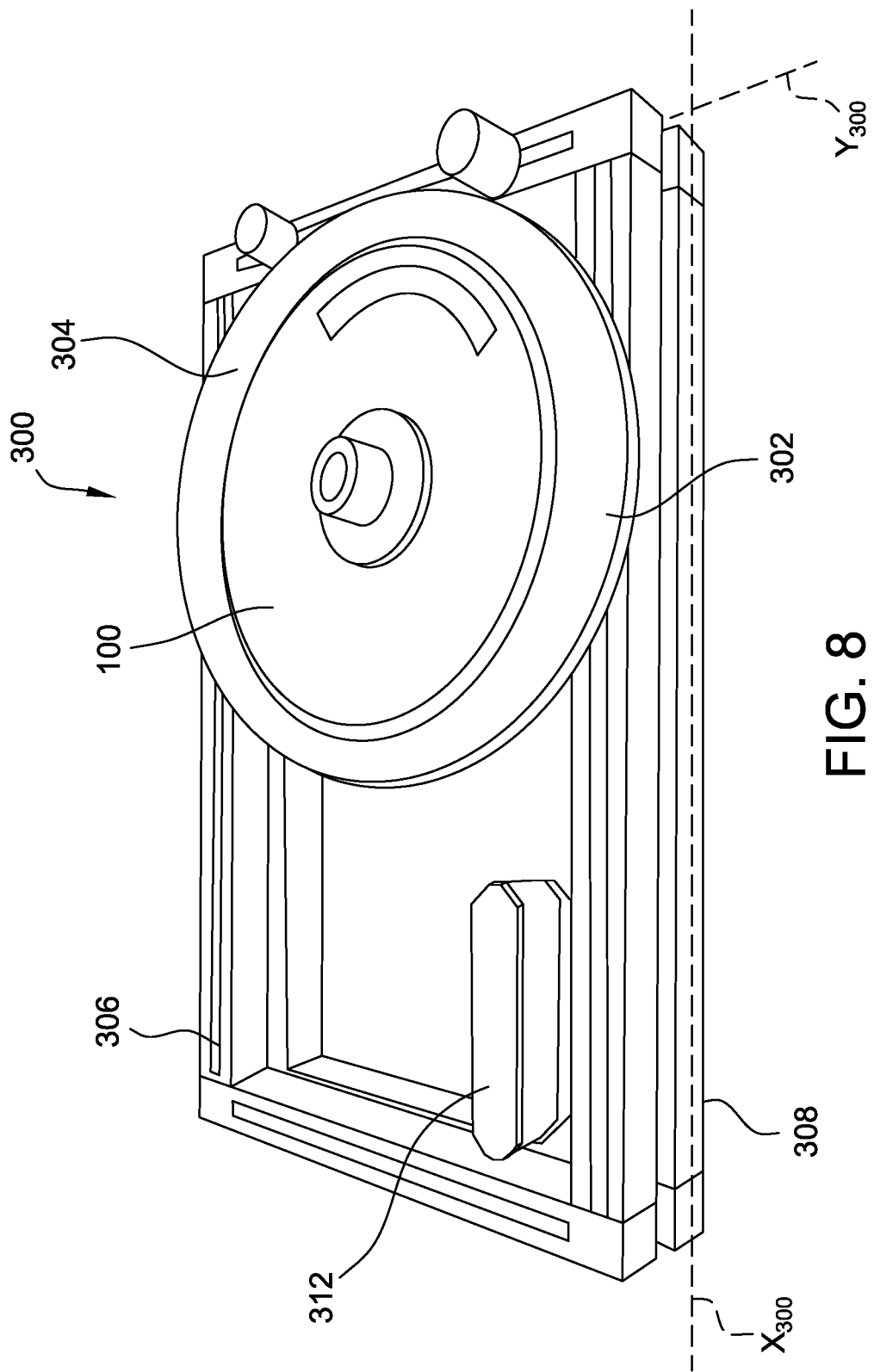
FIG. 8 is a perspective view of the testing apparatus with a heatsink disposed thereon.

To evaluate the parameter related to the coefficient of friction of the elastomeric coating (e.g., to determine the temperature evolution of the semiconductor structures that are held by the heatsink 100 during ion implantation), the heatsink 100 is removed from the ion implanter apparatus 200 after one or more cycles of implanting ions into a semiconductor structure (e.g., at least 10, at least 100, at least 1000, or least 5,000, or at least 10,000 cycles of ion implantation). The parameter related to the coefficient of friction is then determined experimentally (and may be compared to a baseline parameter such as the value of the parameter for a new or reconditioned heatsink as described further below). For example and with reference to FIG. 7, an embodiment of a testing apparatus 300 for determining the parameter related to the coefficient of friction is provided. As shown in FIG. 8, the heatsink 100 is positioned on the testing apparatus 300 after a cycle of ion implantation to measure the parameter related to the coefficient of friction of the heatsink 100.

Figure 9:
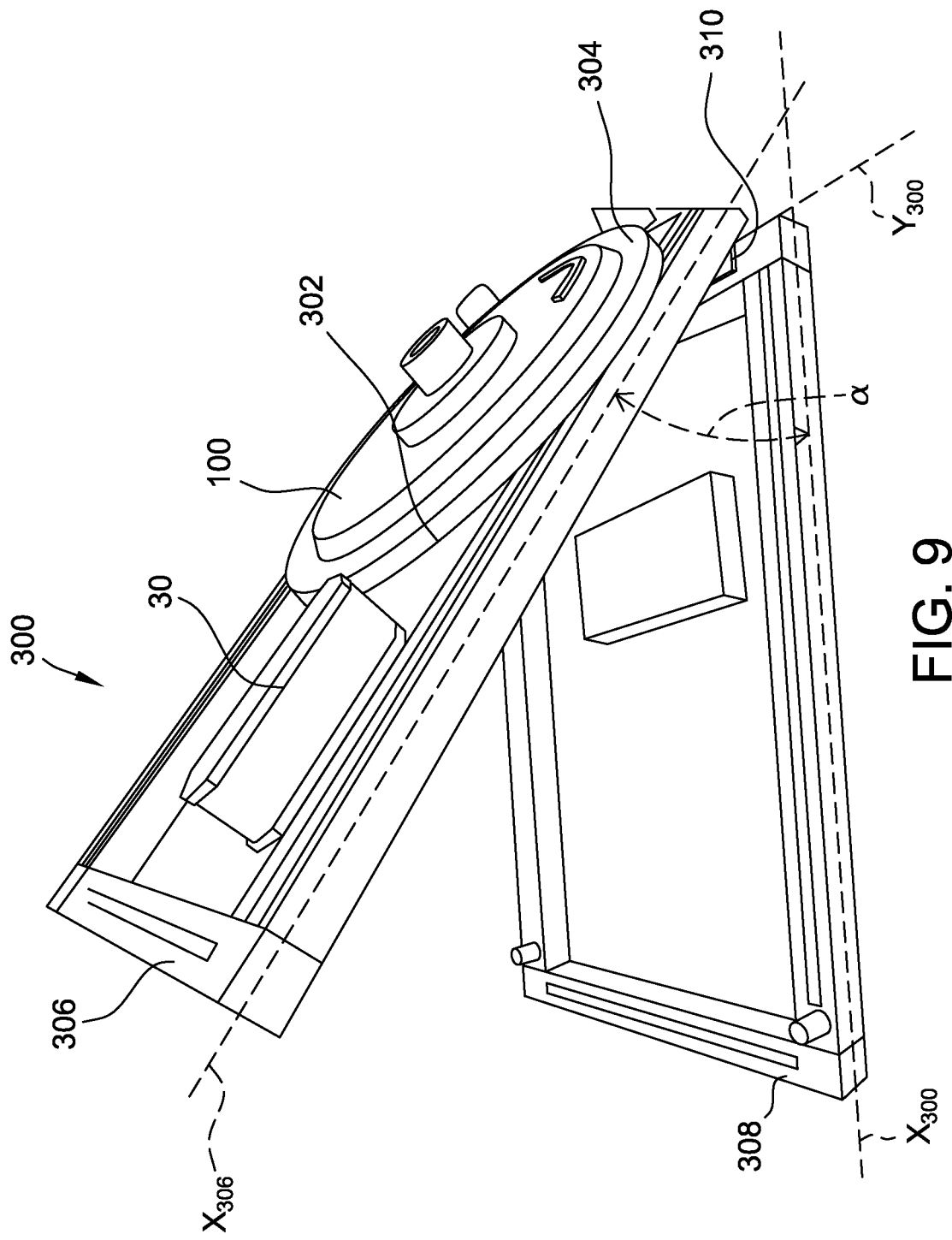
FIG. 9 is a perspective view of the testing apparatus and heatsink during testing.

The testing apparatus 300 includes a plate 302 having a plate surface 304. The plate 302 is supported by a frame 306 that is pivotally connected to a base 308 by a hinge 310 (FIG. 9). The plate surface 304 is parallel to a longitudinal axis $X_{306}$ of the frame 306. The frame 306 pivots about a pivot axis $Y_{300}$. The frame 306 may be rotated about the pivot axis $Y_{300}$, such that the longitudinal axis $X_{306}$ of the frame 306 (and plate surface 304) are tilted at an inclination angle α relative to the base 308 and horizontal axis $X_{300}$. The horizontal axis $X_{300}$ is generally parallel to the ground and perpendicular to the pivot axis $Y_{300}$. The frame 306 and the plate 302 may be manually rotated about the hinge 310. Alternatively and/or additionally, a motor may be used to pivot the frame 306 and the plate 302.

The heatsink 100 may be placed on the plate surface 304 such that the elastomeric coating 104 (FIG. 2) is in contact with the plate surface 304. Accordingly, the parameter related to the coefficient of friction of the heatsink 100 corresponds to the coefficient of friction between the elastomeric coating 104 and the plate surface 304.

The plate 302 may be made of any suitable material such that the plate surface 304 has properties which enable determination of the parameter related to the coefficient of friction of the heatsink 100. The plate 302 may be made of a ceramic material and the plate surface 304 may be generally smooth. The plate surface 304 may be polished or have a low surface roughness.

When the inclination angle α is zero (FIG. 8), the plate surface 304 is parallel to the horizontal axis $X_{300}$ and there is no frictional force between the plate surface 304 and the heatsink 100. The plate 302 is rotated about the pivot axis $Y_{300}$ until the heatsink 100 begins to slide on the plate surface 304. One or more rotational sensors 312 are used to measure and/or record the inclination angle α at which the heatsink 100 begins to slide (i.e., the "critical angle $α_c$" or the slide angle $α_c$"). The parameter related to the coefficient of friction may be this critical angle $α_c$. Alternatively, the critical angle $α_c$ may be used to determine the parameter related to the coefficient of friction.

Sliding of the heatsink 100 may be observed using visual inspection. In some embodiments, one or more motion sensors (not shown) are used to detect the motion of the heatsink 100 in order to detect the critical angle $α_c$ at which the heatsink 100 begins to slide. In some embodiments, the rotational sensors 312 are linked to the motion detection sensors, such that detection of sliding of the heatsink 100 triggers an automatic recording of the critical angle $α_c$ by the rotational sensors 312.

In some cases, the parameter related to the coefficient of friction is related to the static friction of the heatsink 100. Alternatively and/or additionally, the parameter related to the coefficient of friction is related to the dynamic friction of the heatsink 100. In some embodiments, the parameter related to the coefficient of friction may be related to a break-away force which is a force at which sliding of the heatsink 100 initiates (e.g., on a horizontal surface). For example, the parameter related to the coefficient of friction may be determined by application of a variable force F applied to the heatsink 100 resting on a horizontal surface. The variable force F may be increased until initiation of sliding of the heatsink 100 occurs. The variable force F at which sliding is initiated (i.e., a critical force Fc) is recorded. One or more motion sensors may be used to detect the motion of the heatsink 100. One or more load cells may be used to record the variable force F and/or the critical force Fc. The parameter related to the coefficient of friction may be determined using other experimental techniques.

In other embodiments, rather than a parameter related to the coefficient of friction, a parameter related to the hardness of the heatsink 100 or the color of the heatsink 100 is sensed to determine if the heatsink should be reconditioned or may be used to process additional semiconductor structures.

After measuring the parameter related to the coefficient of friction of the heatsink 100, the parameter is compared to a baseline range. In some embodiments, the baseline may be determined by evaluating the parameter related to the coefficient of friction of the elastomeric coating for a new or reconditioned heatsink prior to the installation of a new or reconditioned heatsink 100 on the implanter apparatus 200. The baseline range may be an acceptable deviation from the parameter related to the coefficient of friction of the heatsink. If the parameter falls outside of the baseline range, the heatsink 100 is reconditioned. If the parameter falls within the baseline range, the heatsink 100 is used during ion implantation of additional semiconductor structures 10. For example, if the critical angle $α_c$ at which the heatsink begins to slide is less than a threshold angle, the heatsink 100 may be reconditioned. The baseline range may be determined by measuring the parameter related to the coefficient of friction of the heatsink 100 for heatsinks that are known to provide inadequate thermal properties (e.g., thermal conductance). The baseline may be age specific (e.g., expected degradation for heatsinks of a particular age, i.e., "within batch variation").

In some embodiments, each heatsink 100 is evaluated at regular intervals (e.g., 1000 cycles) to monitor the heatsink 100 to determine the implant temperature condition. Evaluation may be used to adjust downstream process parameters to accommodate for temperature changes caused by degradation of the heatsink coating.

If the material of the plate 302 or the plate surface 304 is altered or changed, e.g., the plate surface 304 is re-polished, the plate 302 and heatsink 100 should be recalibrated to determine an updated baseline range for the parameter related to the coefficient of friction. Different baseline ranges may be used for different type of elastomeric coatings.

In preparation for determining the parameter related to the coefficient of friction, prior to positioning the heatsink 100 on the plate 302 of the testing apparatus 300, the plate surface and the elastomeric coated surface of the heatsink 100 may be cleaned and dried. Cleaning the elastomeric coating 104 ensures that the contacting surfaces are devoid of particulates or other debris that may influence determination of the parameter related to the coefficient of friction.

If the heatsink falls outside of a baseline range (e.g., below a minimum inclination angle $α_c$), the heatsink 100 may be reconditioned (e.g., with a substitute heatsink 100 being used in the implanter apparatus 200 while reconditioning). The heatsink 100 may be reconditioned by stripping the elastomeric coating 104 from the substrate 102 and depositing a second elastomeric coating 104 on the substrate 102. In some cases, the heatsink 100 may be disposed of. The heatsinks 100 may be evaluated on a regular basis (e.g., during preventative maintenance or when process degradation indicates that a heatsink should be evaluated) depending on the age of the elastomeric coating and the strictness of the process temperature window (e.g., with additional testing occurring during break-in of the heatsink).

Compared to conventional methods for ion implantation, the methods and systems of the present disclosure have several advantages. Determining the parameter related to the coefficient of friction and comparing the parameter to a baseline allows for objective evaluation of the wear and degradation of the elastomeric coating of the heatsink which affects the ability of the heatsink to dissipate heat from the semiconductor structure during ion implantation. Determining the parameter related to the coefficient of friction provides a relatively repeatable, quick, non-destructive, and cost effective approach to evaluating the entire elastomeric coating. Periodic evaluation of the elastomeric coating by determining if the parameter related to the coefficient is greater than a baseline range and/or whether the rate of the change follows the downstream process window provides valuable and practical guidance for quality control and process tuning. Reconditioning of the elastomeric coating prevents inconsistencies in ion implantation. Evaluating the parameter related to the coefficient of friction provides relatively quick feedback which enables downstream process parameter adjustment which reduces the risk of process window shift resulting in high quality and high yield of semiconductor structures.

EXAMPLES

The processes of the present disclosure are further illustrated by the following Examples. These Examples should not be viewed in a limiting sense.

Example 1: Baseline of Heatsinks' Coefficient of Friction

Figure 10:
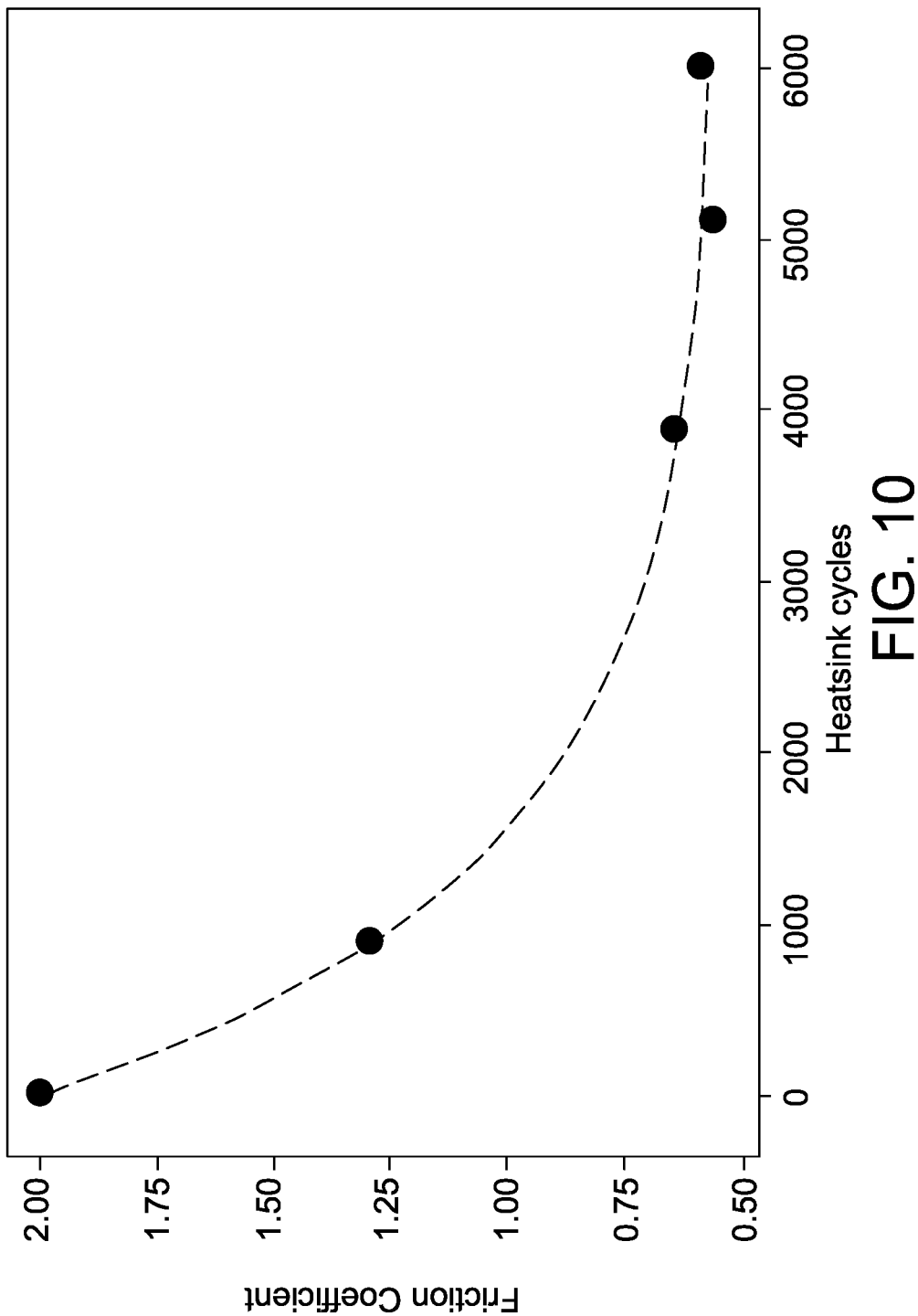
FIG. 10 is a graph showing the change in the friction coefficient for heatsinks as a function of the number of cycles.

FIG. 10 shows a baseline of the coefficient of friction as a function of the heatsink cycles. As can be seen from FIG. 10, the rate of the degradation of the elastomeric coating is faster at the beginning of the heatsink's life.

Example 2: Detection of Abnormally Aged Heatsink within a Batch

Figure 11:
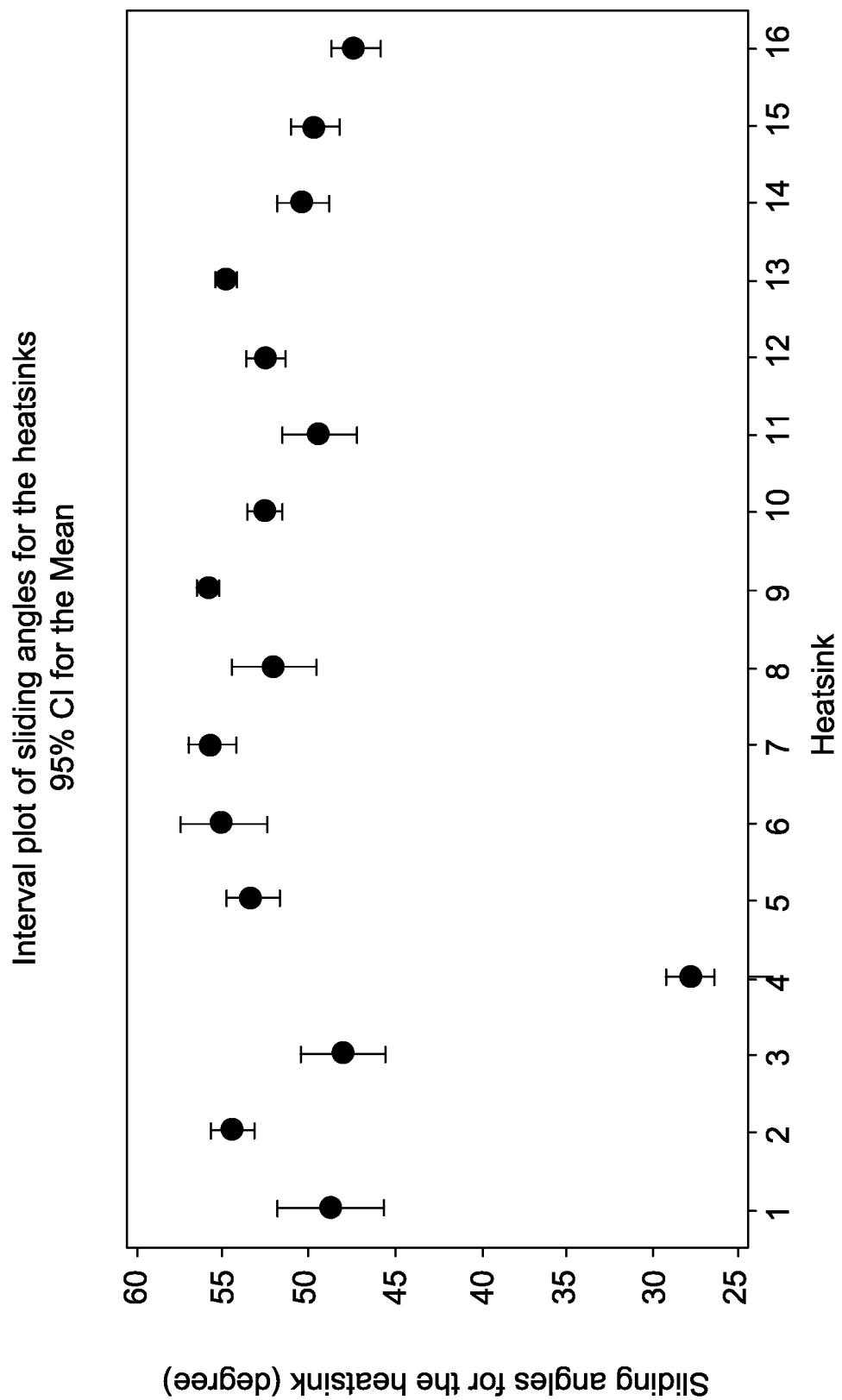
FIG. 11 is an interval plot of the sliding angles for a batch of heatsinks of an implanter apparatus.

A batch of heatsinks was installed on an implanter wheel. As the implanter was used for ion implantation over a number of cycles, 5-6% of wafers exhibited poor layer transfer yield. Commonality test indicated that the wafers were processed on the same heatsink. A friction coefficient test (i.e., sliding angle test) was performed by the apparatus shown in FIGS. 7-9 for the entire batch of the heatsinks on the implanter. As shown in FIG. 11, the tests showed an outlier sliding angle for one of the heatsinks and the bad heatsink was replaced.

Example 3: Detection of Abnormally Aging Heatsink

Figure 12:
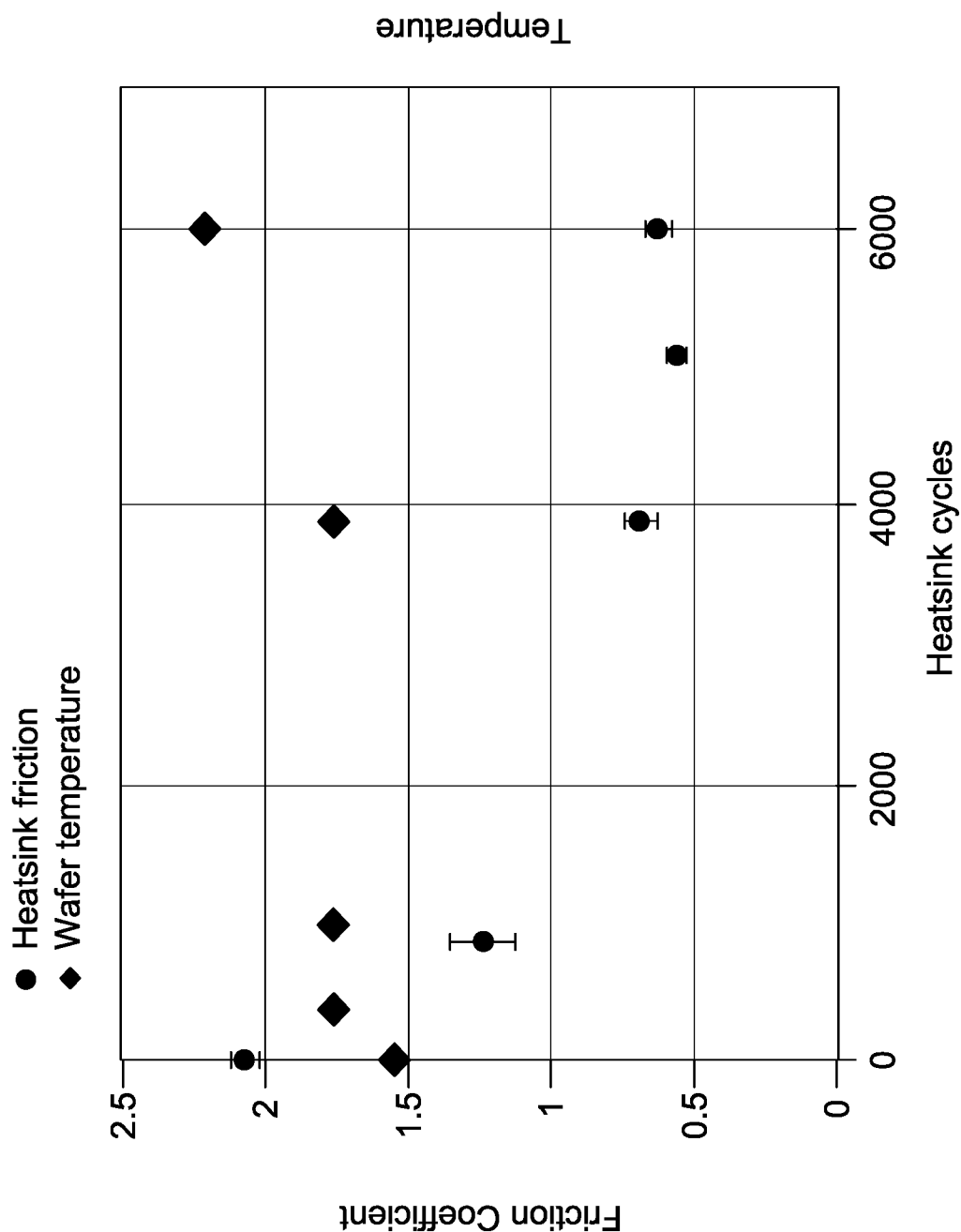
FIG. 12 is a graph showing the heatsink friction coefficient and temperature of semiconductor structures implanted on the heatsink.

Heatsink aging causes a decrease in the sliding angle and coefficient of fiction of the heatsink which follows an exponential relation with the number of cycles (FIG. 10). In FIG. 12, the evolution of the friction coefficient is mapped to the temperature of the wafers measured by the temperature indicator on the front surface of the semiconductor structure. FIG. 12 indicates that, as the sliding angle decreases, the temperature of the wafer increases, due to lack of effective heat transfer from the backside of the semiconductor structure to the heat sink. The friction coefficient (e.g., sliding angle) can be used to quantitatively predict the process parameter (temperature) of the semiconductor during the process.

As used herein, the terms "about," "substantially," "essentially," and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for implanting a semiconductor structure with ions, the semiconductor structure having a front surface and rear surface opposite the front surface, the method comprising:
   positioning the semiconductor structure on a heatsink with the rear surface of the semiconductor structure contacting the heatsink;
   implanting ions through the front surface of the semiconductor structure while the semiconductor structure is positioned on the heatsink to form a damage region in the semiconductor structure, the heatsink being disposed on an ion implanter apparatus during ion implantation, the ion implanter apparatus rotating the heatsink during ion implantation;
   removing the heatsink from the ion implanter apparatus and positioning the heatsink on a testing apparatus after ions are implanted through the front surface of the semiconductor structure;
   measuring a slide-angle or break-away force of the heatsink on a surface while the heatsink is positioned on the testing apparatus; and
   comparing the slide-angle or break-away force to a baseline range of the slide-angle or break-away force;
   wherein:
   (1) if the slide-angle or break-away force falls outside of the baseline range, the heatsink is reconditioned; and
   (2) if the slide-angle or break-away force falls within the baseline range, the heatsink is used during ion implantation of additional semiconductor structures.

2. The method as set forth in claim 1 wherein the heatsink comprises a substrate and an elastomeric coating disposed on at least one surface of the substrate, the elastomeric coating contacting the semiconductor structure during ion implantation.

3. The method as set forth in claim 1 wherein the semiconductor structure is a layered structure.

4. The method as set forth in claim 2 wherein the substrate is made of aluminum or stainless steel.

5. The method as set forth in claim 2 wherein the elastomeric coating is a silicone elastomer.

6. The method as set forth in claim 1 wherein the heatsink comprises a substrate and an elastomeric coating disposed on the substrate and the heatsink is reconditioned by stripping the elastomeric coating from the substrate and depositing a second elastomeric coating on the substrate.

7. A method for evaluating suitability of a heatsink for ion implantation of a semiconductor structure, the heatsink comprising a substrate and an elastomeric coating disposed on at least one surface of the substrate, the method comprising:
  positioning the heatsink on a testing apparatus, the testing apparatus including a plate with a plate surface, the heatsink being positioned on the plate surface such that the elastomeric coating is in contact with the plate surface;
  measuring a slide-angle of the elastomeric coating by rotating the plate about a pivot axis until the heatsink begins to slide on the plate surface; and
  comparing the slide-angle to a baseline range of the slide-angle;
  wherein:
  (1) if the slide-angle falls outside of the baseline range, the heatsink is reconditioned; and
  (2) if the slide-angle falls within the baseline range, the heatsink is used during ion implantation of the semiconductor structure.

8. The method as set forth in claim 7 wherein the substrate is made of aluminum or stainless steel.

9. The method as set forth in claim 8 wherein the elastomeric coating is a silicone elastomer.

10. The method as set forth in claim 7 wherein the heatsink is reconditioned by stripping the elastomeric coating from the substrate and depositing a second elastomeric coating on the substrate.

11. A method for evaluating suitability of a heatsink for ion implantation of a semiconductor structure, the heatsink comprising a substrate and an elastomeric coating disposed on at least one surface of the substrate, the method comprising:
  positioning the heatsink on a horizontal surface; and
  measuring a break-away force of the elastomeric coating by applying a variable force to the heatsink, the variable force increasing until the heatsink begins to slide on the horizontal surface; and
  comparing the break-away force to a baseline range of the break-away force;
  wherein:
  (1) if the break-away force falls outside of the baseline range, the heatsink is reconditioned; and
  (2) if the break-away force falls within the baseline range, the heatsink is used during ion implantation of the semiconductor structure.

12. The method as set forth in claim 11 wherein the substrate is made of aluminum or stainless steel.

13. The method as set forth in claim 11 wherein the elastomeric coating is a silicone elastomer.

14. The method as set forth in claim 11 wherein the heatsink is reconditioned by stripping the elastomeric coating from the substrate and depositing a second elastomeric coating on the substrate.

15. The method as set forth in claim 1 wherein:
  the slide-angle of the heatsink is measured;
  the slide-angle of the heatsink is compared to a baseline range of the slide-angle;
  wherein:
  (1) if the slide-angle falls outside of the baseline range, the heatsink is reconditioned; and
  (2) if the slide-angle falls within the baseline range, the heatsink is used during ion implantation of additional semiconductor structures.

16. The method as set forth in claim 1 wherein:
  the break-away force of the heatsink is measured;
  the break-away force of the heatsink is compared to a baseline range of the break-away force;
  wherein:
  (1) if the break-away force falls outside of the baseline range, the heatsink is reconditioned; and
  (2) if the break-away force falls within the baseline range, the heatsink is used during ion implantation of additional semiconductor structures.

* * * * *